United States Patent [19]
Takehana et al.

[11] Patent Number: 5,924,912
[45] Date of Patent: Jul. 20, 1999

[54] PHOTOSENSITIVE RESIN COMPOSITION FOR SANDBLAST RESIST

[75] Inventors: Hiroshi Takehana, Otsu; Tetsuo Yamamoto, Kyoto; Hiroyuki Obiya, Kawasaki; Ryuma Mizusawa, Chigasaki, all of Japan

[73] Assignees: Matsushita Electronics Corporation; Tokyo Ohka Kogyo Co., Ltd., both of Japan

[21] Appl. No.: 09/018,730

[22] Filed: Feb. 4, 1998

Related U.S. Application Data

[62] Division of application No. 08/638,189, Apr. 26, 1996, Pat. No. 5,756,261.

[30] Foreign Application Priority Data

May 1, 1995 [JP] Japan ................................. 7-107703

[51] Int. Cl.⁶ ........................................................ B24B 1/00
[52] U.S. Cl. ............................................. 451/29; 430/284.1
[58] Field of Search .................................. 451/28, 29, 30, 451/31; 430/284.1, 910, 911; 522/95, 88

[56] References Cited

U.S. PATENT DOCUMENTS

| | | |
|---|---|---|
| 3,850,770 | 11/1974 | Juna et al. . |
| 4,250,248 | 2/1981 | Faust . |
| 4,430,416 | 2/1984 | Goto et al. . |
| 4,458,007 | 7/1984 | Geissler et al. . |
| 4,587,186 | 5/1986 | Nakamura et al. . |
| 4,705,740 | 11/1987 | Geissler et al. . |
| 4,849,321 | 7/1989 | Hung et al. ................................. 522/96 |
| 4,855,077 | 8/1989 | Shikinami et al. ....................... 252/518 |
| 5,102,774 | 4/1992 | Settachayanon ........................... 522/97 |
| 5,155,143 | 10/1992 | Koleske ................................... 522/170 |

FOREIGN PATENT DOCUMENTS

| | | |
|---|---|---|
| 0 005 750 | 12/1979 | European Pat. Off. . |
| 0 130 559 | 1/1985 | European Pat. Off. . |
| 0 674 225 | 9/1995 | European Pat. Off. . |

*Primary Examiner*—Timothy V. Eley
*Assistant Examiner*—Derris H. Banks
*Attorney, Agent, or Firm*—Wenderoth, Lind & Ponack, L.L.P.

[57] ABSTRACT

Disclosed is a photosensitive resin composition suitable as a resist material against sandblasting for pattern-wise engraving of the surface of a body after photolithographic patterning, which comprises: (a) a urethane compound having a (meth)acrylate group at the molecular end, which is obtained from a polyether or polyester compound having a hydroxy group at the molecular chain end, a diisocyanate compound and a (meth)acrylate compound having a hydroxy group; (b) an alkali-soluble polymeric compound having an acid value in the range from 50 to 250 mg KOH/g; and (c) a photopolymerization initiator.

2 Claims, 1 Drawing Sheet

PHOTOSENSITIVE RESIN COMPOSITION FOR SANDBLAST RESIST

This is a divisional of application Ser. No. 08/638,189, filed Apr. 26, 1996, now U.S. Pat. No. 5,756,261.

BACKGROUND OF THE INVENTION

The present invention relates to a novel photosensitive resin composition or, more particularly, to a photosensitive resin composition capable of giving a layer of the cured resin composition on a substrate surface suitable as a resist in sandblast engraving works by virtue of the good pliability to withstand the mechanical attack in the sandblasting and insusceptibility to accumulation of static electricity which may cause some troubles due to discharge. The invention also relates to a photosensitive dry film for a sandblast resist by the use of the above mentioned novel photosensitive resin composition as well as a method for patterning of a substrate surface by sandblast engraving using the same.

It is sometimes desired to form a relief pattern on the surface of a substrate of a material such as plates of glass, marble, plastic resin and the like for a decorative purpose or for the purpose of patterning in the manufacture of electronic devices such as circuit boards and plasma display panels in which patterns of both a metal and a ceramic are formed on the same substrate surface. One of the methods for such relief patterning is the method of pattern-wise engraving by sandblast in which a layer of a photosensitive resin composition is formed on the substrate surface from which a patterned resist layer is formed by the method of photolithography and the exposed or unmasked areas of the substrate surface are engraved by sandblast with blowing of abrasive particles at the surface.

Various photosensitive resin compositions have been proposed heretofore to serve as a sandblast resist including those comprising an unsaturated polyester resin, unsaturated monomer and photopolymerization initiator disclosed in Japanese Patent Kokai 55-103554 and those comprising a polyvinyl alcohol and diazo resin disclosed in Japanese Patent Kokai 2-69754.

These photosensitive resin compositions, however, have a problem in general that, when a patterned resist layer is formed from the resin composition on the substrate surface and engraving of the substrate surface is performed by sandblast with the resist layer as a masking, the substrate surface is charged with static electricity eventually to cause discharge so that the substrate made from glass or marble is stained or damaged by the occurrence of chipping or a circuit board as the substrate is subject to troubles such as line break and short-circuit due to damages on the wiring pattern or destruction of the insulating layer.

SUMMARY OF THE INVENTION

The present invention accordingly has an object, in view of the above described problems and disadvantages in the prior art, to provide a novel and improved photosensitive resin composition capable of giving a photolithographically patterned resist layer having good elasticity and pliability as an inherent requisite for a sandblast resist with excellent adhesive bonding to the substrate surface and good alkali-developability and good formability to give a dry film as well as insusceptibility to the accumulation of static electricity so as to be freed from the troubles due to electric discharge.

Thus, the photoresist resin composition of the invention suitable for use as a resist material against sandblasting is a uniform blend which comprises:

(a) a urethane compound having a (meth)acrylate group at the molecular end, which is obtained from a polyether or polyester compound having a hydroxy group at the molecular chain end, a diisocyanate compound and a (meth)acrylate compound having a hydroxy group;

(b) an alkali-soluble polymeric compound having an acid value in the range from 50 to 250 mg KOH/g; and (c) a photopolymerization initiator.

DETAILED DESCRIPTION OF THE PREFERRED EMBODIMENTS

Figure 1:
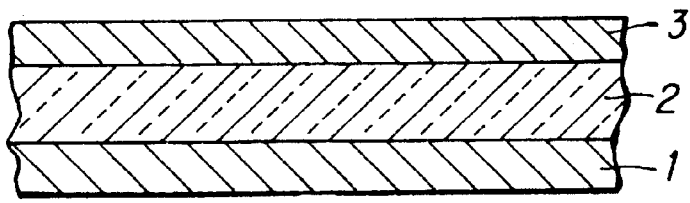
FIG. 1 is a vertical cross sectional view showing the laminated structure of a photosensitive dry film by the use of the inventive photosensitive resin composition.

As is described above, the inventive photosensitive resin composition comprises, as the essential ingredients, the components (a), (b) and (c), of which the most characteristic is the component (a). This ingredient in the inventive composition is a unique urethane compound having a (meth)acrylate, i.e. acrylate or methacrylate, group at the molecular end, which can be prepared by the reaction of i) a polyether or polyester compound having a hydroxy group at the molecular chain end with an excessive amount of ii) a diisocyanate compound to give a polyether or polyester compound having an isocyanate group at the molecular chain end followed by a further reaction of the isocyanate group with an equimolar amount of iii) a (meth)acrylate compound having a hydroxy group at the molecular chain end. For example, the urethane compound as the component (a) is represented by the general formula

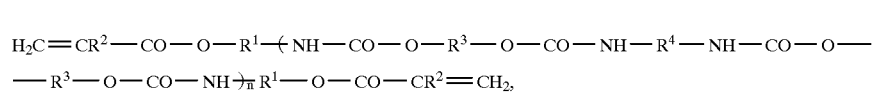

(I)

$$H_2C=CR^2-CO-O-R^1\!-\!(NH-CO-O-R^3-O-CO-NH-R^4-NH-CO-O-$$
$$-R^3-O-CO-NH)_n\, R^1-O-CO-CR^2=CH_2,$$

in which $R^1$ is an alkylene group optionally including at least one ether linkage between two carbon atoms, $R^2$ is a hydrogen atom or a methyl group, $R^3$ is a divalent residue derived from the diisocyanate compound $OCN-R^3-NCO$ by eliminating the two isocyanate groups $-NCO$, $R^4$ is a divalent residue derived from the polyether or polyester compound $HO-R^4-OH$ and the subscript n is an integer not exceeding 5. Though not particularly limitative and any of conventional polyester compounds obtained by the condensation reaction between a diol and a dibasic carboxylic acid can be used, the divalent residue $R^4$ is preferably a residue derived from a polyester obtained by the ring-opening polymerization of a lactone compound or a residue derived from a polycarbonate diol as a kind of polyester compounds in respect of the relatively low insulating resistance not to cause a trouble due to electric discharge during the sandblast treatment.

Examples of the above mentioned lactone compound from which a polyester is obtained by the ring-opening polymerization include: δ-valerolactone, ε-caprolactone, β-propiolactone, α-methyl-β-propiolactone, β-methyl-β-propiolactone, α,α-dimethyl-β-propiolactone, β,β-dimethyl-β-propiolactone and the like.

The polycarbonate diol as a polyester can be prepared by the reaction of a diol compound such as bisphenol A and dihydroxy cyclohexane with a carbonyl compound such as diphenyl carbonate, phosgene and succinic anhydride.

Besides, the polyester compound which can be used in the preparation of the component (a) includes those obtained by the condensation reaction between an alkyleneglycol such as ethyleneglycol and propyleneglycol or an alkyleneglycol, of which the alkylene group is interrupted by one or more of ether linkages, such as diethyleneglycol, triethyleneglycol and dipropyleneglycol and a dibasic carboxylic acid such as maleic acid, fumaric acid, glutaric acid and adipic acid.

Further, the component (a) can be prepared, instead of the polyester compound described above, from a hydroxyterminated polyether compound obtained by the condensation reaction of an alkyleneglycol compound including polyethyleneglycol, polypropyleneglycol, polytetramethyleneglycol and polypentamethyleneglycol.

It is preferable to introduce, into the above described polyester or polyether compound, a residue derived from 2,2-bis(hydroxymethyl) propionic acid, 2,2-bis(2-hydroxyethyl) propionic acid or 2,2-bis(3-hydroxypropyl) propionic acid or, more preferably, 2,2-bis(hydroxymethyl) propionic acid because the urethane compound derived from such a polyester or polyether compound is imparted with good alkali-solubility. Though not particularly limitative, the polyester or polyether compound has a molecular weight preferably in the range from 200 to 4000.

Examples of preferable diisocyanate compounds to be reacted with the above described polyester or polyether compound include aliphatic and alicyclic diisocyanate compounds such as dimethylene diisocyanate, trimethylene diisocyanate, tetramethylene diisocyanate, pentamethylene diisocyanate, hexamethylene diisocyanate, heptamethylene diisocyanate, 1,5-diisocyanato-2,2-dimethyl pentane, octamethylene diisocyanate, 1,6-diisocyanato-2,5-dimethyl hexane, 1,5-diisocyanato-2,2,4-trimethyl pentane, nonamethylene diisocyanate, 1,6-diisocyanato-2,2,4-trimethyl hexane, 1,6-diisocyanato-2,4,4-trimethyl hexane, decamethylene diisocyanate, isophorone diisocyanate and the like. Diisocyanate compounds having an aromatic ring structure in the molecule are less preferable because of an increase in the insulating resistance of the urethane compound along with a low adhesive bonding strength to the substrate surface and an increased film thickness reduction by sandblasting.

It is sometimes the case that, while the reaction product obtained by the reaction of the hydroxy-terminated polyester or polyether compound with the diisocyanate compound may have an isocyanato group at the molecular chain end, such an isocyanato group may react further with the hydroxy group at the molecular chain end of the polyester or polyether compound to form a polyurethane compound. When such is the case, it is preferable that the number of repetition of the polyester or polyether residue does not exceed 5.

The component (a), which is a urethane compound having (meth)acrylate groups at the molecular chain ends can be prepared by reacting a (meth)acrylate compound having a hydroxy group as the reactant iii) with the isocyanato groups in the above described reaction product of the hydroxyterminated polyester or polyether compound as the reactant i) and the diisocyanate compound as the reactant ii).

Examples of the (meth)acrylate compounds having a hydroxy group include those having polymerizability such as: hydroxymethyl acrylate, hydroxymethyl methacrylate, 2-hydroxyethyl acrylate, 2-hydroxyethyl methacrylate, 3-hydroxypropyl acrylate, 3-hydroxypropyl methacrylate, ethyleneglycol monoacrylate, ethyleneglycol monomethacrylate, glycerol monoacrylate, glycerol monomethacrylate, dipentaerythritol monoacrylate, dipentaerythritol monomethacrylate and the like. These hydroxy-containing (meth)acrylate compounds react with the isocyanato groups in the intermediate so as to provide a urethane compound having polymerizable double bonds at the molecular chain ends.

While the component (a) obtained by the reaction of the hydroxy-containing (meth)acrylate compound with the intermediate having isocyanato groups contains carboxyl groups introduced thereinto, the acid value of the component (a) should not exceed 70 mg KOH/g or, preferably, in the range from 20 to 50 mg KOH/g. When the acid value of the component (a) is too high, the cured layer obtained from the composition loses pliability along with a decrease in the water resistance.

The urethane compound as the component (a) has a molecular weight in the range from 1000 to 30000 or, preferably, from 2000 to 20000. When the molecular weight thereof is too small, the layer of the resin composition on the substrate surface after curing loses pliability not to withstand the mechanical attack in the sandblasting due to the decrease in the bonding strength while, when the molecular weight is too large, the photosensitive resin composition containing such a urethane compound dissolved in an organic solvent has an unduly high viscosity to cause a great decrease in the workability of coating works.

The component (b) in the inventive photosensitive resin composition is an alkali-soluble polymeric resin which is selected preferably from the group consisting of copolymers of (meth)acrylic acid and a (meth)acrylic acid ester and carboxyl group-containing cellulose resins.

Examples of the monomers from which the above mentioned copolymers of (meth)acrylic acid and a (meth)acrylic acid ester is prepared include: acrylic acid, methacrylic acid, fumaric acid, maleic acid, crotonic acid, cinnamic acid, monomethyl fumarate, monoethyl fumarate, monopropyl fumarate, monomethyl maleate, monoethyl maleate, monopropyl maleate, sorbic acid, hydroxymethyl acrylate, hydroxymethyl methacrylate, 2-hydroxyethyl acrylate, 2-hydroxyethyl methacrylate, 3-hydroxypropyl acrylate, 3-hydroxypropyl methacrylate, ethyleneglycol monomethyl ether monoacrylate, ethyleneglycol monomethyl ether monomethacrylate, ethyleneglycol monoethyl ether monoacrylate, ethyleneglycol monoethyl ether monomethacrylate, glycerol monoacrylate, glycerol monomethacrylate, dipentaerythritol pentaacrylate, dipentaerythritol pentamethacrylate, 2-dimethylaminoethyl acrylate, 2-dimethylaminoethyl methacrylate, tetrahydrofurfuryl acrylate, tetrahydrofurfuryl methacrylate, acrylamide, methacrylamide, acrylonitrile, methacrylonitrile, methyl acrylate, methyl methacrylate, ethyl acrylate, ethyl methacrylate, butyl acrylate, butyl methacrylate, isobutyl acrylate, isobutyl methacrylate, 2-ethylhexyl acrylate, 2-ethylhexyl methacrylate, benzyl acrylate, benzyl methacrylate, diethyleneglycol monoethyl ether monoacrylate, diethyleneglycol monoethyl ether monomethacrylate, ε-caprolactone-modified tetrahydrofurfuryl acrylate, ε-caprolactone-modified tetrahydrofurfuryl methacrylate, diethyleneglycol monoethyl ether monoacrylate, isodecyl acrylate, isodecyl methacrylate, octyl acrylate, octyl methacrylate, lauryl acrylate, lauryl methacrylate, tridecyl acrylate, tridecyl methacrylate, stearyl acrylate, stearyl methacrylate and the like.

It is preferable that the copolymer is obtained from a combination of monomers including (meth)acrylic acid and one or more of methyl acrylate, methyl methacrylate, ethyl acrylate and ethyl methacrylate, more preferably, with further addition of n-butyl (meth)acrylate and (meth) acrylonitrile.

Examples of preferable carboxyl group-containing cellulose resins include hydroxyethyl carboxymethyl cellulose and cellulose acetate phthalate, of which cellulose acetate phthalate is more preferable in respect of the good compatibility with the component (a) having carboxyl groups, excellent film-formability to give a high-quality dry film and good alkali-developability.

The compounding proportion of the component (a) to the above mentioned carboxyl group-containing cellulose resin as a class of the component (b) is in the range from 50:50 to 95:5 or, preferably, from 60:40 to 90:10 or, more preferably, from 65:35 to 85:15 by weight. When the amount of the carboxyl group-containing cellulose resin is too large, the cured resist layer of the resin composition has an increased insulating resistance eventually leading to a damage by the electric discharge due to accumulation of static electricity during sandblasting while, when the amount thereof is too small, difficulties are encountered in the preparation of films of the resin composition sometimes to cause the problem of cold flow.

The compounding proportion of the component (a) to the above mentioned (meth)acrylate copolymer as the other class of the component (b) is in the range from 30:70 to 95:5 or, preferably, from 35:65 to 85:15 or, more preferably, from 40:60 to 70:30 by weight. When the amount of the (meth)acrylate copolymer is too large, the cured resist layer of the resin composition has an increased insulating resistance eventually leading to a damage by the electric discharge due to accumulation of static electricity during sandblasting while, when the amount thereof is too small, difficulties are encountered in the preparation of films of the resin composition sometimes to cause the problem of cold flow.

It is preferable that the alkali-soluble polymeric compound as the component (b) is selected from the carboxyl group-containing cellulose resins because the photosensitive resin composition after curing may be free from undue increase in the insulating resistance.

The alkali-soluble polymeric compound as the component (b) should have an acid value in the range from 50 to 250 mg KOH/g or, preferably, from 80 to 200 mg KOH/g. When the acid value is too low, the photosensitive resin composition compounded with such a polymeric compound is sometimes poor in the developability while, when the acid value is too high, a decrease is caused in the pliability of the resist layer after curing along with a decrease in the water resistance.

The component (c) in the inventive photosensitive composition is a photopolymerization initiator which can be selected from various kinds of compounds known in the prior art including 1-hydroxycyclohexyl phenyl ketone, 2,2-dimethoxy-1,2-diphenyl ethan-1-one, 2-methyl-1-[4-(methylthio) phenyl]-2-morpholino propan-1-one, 2-benzyl-2-dimethylamino-1-(4-morpholinophenyl) butan-1-one, 2-hydroxy-2-methyl-1-phenyl propan-1-one, 2,4,6-trimethylbenzoyl diphenylphosphine oxide, 1-[4-(2-hydroxyethoxy)phenyl]-2-hydroxy-2-methyl propan-1-one, 2,4-diethyl thioxanthone, 2-chloro thioxanthone, 2,4-dimethyl thioxanthone, 3,3-dimethyl-4-methoxy benzophenone, benzophenone, 1-chloro-4-propoxy thioxanthone, 1-(4-isopropylphenyl)-2-hydroxy-2-methyl propan-1-one, 1-(4-dodecylphenyl)-2-hydroxy-2-methyl propan-1-one, 4-benzoyl-4'-methyl dimethyl sulfide, 4-dimethylamino benzoic acid, methyl 4-dimethylamino benzoate, ethyl 4-dimethylamino benzoate, butyl 4-dimethylamino benzoate, 2-ethylhexyl 4-dimethylamino benzoate, 2-isoamyl 4-dimethylamino benzoate, 2,2-diethoxy acetophenone, benzyl ketone dimethyl acetal, benzyl ketone β-methoxy diethyl acetal, 1-phenyl-1,2-propyl dioxime-0,0'-(2-carbonyl)ethoxy ether, methyl o-benzoyl benzoate, bis(4-dimethylaminophenyl) ketone, 4,4'-bis (diethylamino) benzophenone, 4,4'-dichloro benzophenone, benzil, benzoin, methoxy benzoin, ethoxy benzoin, isopropoxy benzoin, n-butoxy benzoin, isobutoxy benzoin, tert-butoxy benzoin, p-dimethylamino acetophenone, p-tert-butyl trichloro acetophenone, p-tert-butyl dichloro acetophenone, thioxanthone, 2-methyl thioxanthone, 2-isopropyl thioxanthone, dibenzosuberone, α,α-dichloro-4-phenoxy acetophenone, pentyl 4-dimethylamino benzoate and the like.

Of the above named photopolymerization initiators, preferable ones include 2,2-dimethoxy-1,2-diphenyl ethan-1-one, 2,4,6-trimethylbenzoyl diphenylphosphine oxide, 2,4-diethyl thioxanthone, 2-chloro thioxanthone, 2,4-dimethyl thioxanthone, thioxanthone, 2-methyl thioxanthone, 2-isopropyl thioxanthone, 3,3-dimethyl-4-methoxy benzophenone, benzophenone, 4,4'-bis(diethylamino) benzophenone, 4,4'-dichloro benzophenone, 4-dimethylamino benzoic acid, methyl 4-dimethylamino benzoate, ethyl 4-dimethylamino benzoate, butyl 4-dimethylamino benzoate, 2-ethylhexyl 4-dimethylamino benzoate, 2-isoamyl 4-dimethylamino benzoate, methyl o-benzoyl benzoate and the like, and particularly preferable ones are those of the hydrogen-abstraction type including thioxanthone compounds such as 2,4-diethyl thioxanthone, 2-chloro thioxanthone, 2,4-dimethyl thioxanthone, thioxanthone, 2-methyl thioxanthone and 2-isopropyl thioxanthone and benzophenone compounds such as 3,3-dimethyl-4-methoxy benzophenone, benzophenone, 4,4'-bis (diethylamino) benzophenone and 4,4'-dichloro benzophenone as well as combinations of these thioxanthone compounds or benzophenone compounds with a compound having a nitrogen atom in the molecule and capable of exhibiting a photopolymerization promoting effect such as 4-dimethylamino benzoic acid, methyl 4-dimethylamino benzoate, ethyl 4-dimethylamino benzoate, butyl 4-dimethylamino benzoate, 2-ethylhexyl 4-dimethylamino benzoate, isoamyl 4-dimethylamino benzoate, methyl o-benzoyl benzoate and pentyl 4-dimethylamino benzoate in respect of the excellent cross sectional profile of the patterned resist layer after curing as well as absence of an undue increase in the insulating resistance of the resist layer after curing due to the photopolymerization initiator per se. The amount of the photopolymerization initiator in the inventive composition is in the range from 0.1 to 20 parts by weight per 100 parts by weight of the non-volatile matter in the composition.

It is desirable that the photosensitive resin composition of the invention after curing by exposure to ultraviolet light has a glass transition point in the range from −40 to 100° C. or, preferably, from 30 to 80° C. When the glass transition point of the cured resin composition is too low, degradation is caused in the physical properties of the resist layer while, when the glass transition point is too high, the cured resist layer loses pliability so that the resistance thereof against sandblasting is decreased.

Though optional, it is preferable that the inventive photosensitive resin composition is admixed with a photopolymerizable monomeric compound with an object to further increase the sensitivity of the composition and to decrease undesirable film thickness reduction and swelling in the development treatment.

The above mentioned additional photopolymerizable monomer is selected from monofunctional monomers including acrylic acid, methacrylic acid, fumaric acid, maleic acid, monomethyl fumarate, monoethyl fumarate, 2-hydroxyethyl acrylate, 2-hydroxyethyl methacrylate, ethyleneglycol monomethyl ether monoacrylate, ethyleneglycol monomethyl ether monomethacrylate, ethyleneglycol monoethyl ether monoacrylate, ethyleneglycol monoethyl ether monomethacrylate, glycerol monoacrylate, glycerol monomethacrylate, acrylamide, methacrylamide, acrylonitrile, methacrylonitrile, methyl acrylate, methyl methacrylate, ethyl acrylate, ethyl methacrylate, isobutyl acrylate, isobutyl methacrylate, 2-ethylhexyl acrylate, 2-ethylhexyl methacrylate, benzyl acrylate, benzyl methacrylate and the like, and polyfunctional monomers including ethyleneglycol diacrylate, ethyleneglycol dimethacrylate, triethyleneglycol diacrylate, triethyleneglycol dimethacrylate, tetraethyleneglycol diacrylate, tetraethyleneglycol dimethacrylate, butyleneglycol dimethacrylate, propyleneglycol diacrylate, propyleneglycol dimethacrylate, trimethylolpropane triacrylate, trimethylolpropane trimethacrylate, tetramethylolpropane tetraacrylate, tetramethylolpropane tetramethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, dipentaerythritol hexamethacrylate, 1,6-hexanediol diacrylate, 1,6-hexanediol dimethacrylate, cardoepoxy diacrylate and the like.

The amount of the above named photopolymerizable monomeric compound, when used, should not exceed 20 parts by weight per 100 parts by weight of the component (a). When the amount thereof is too large, an undesirable phenomenon of cold flow may take place in the dry film prepared from the inventive composition and, in addition, the resist layer formed from the composition after curing by ultraviolet irradiation may lose pliability so as to decrease the resistance against sandblasting.

It is further optional, if necessary, that the viscosity of the inventive photosensitive resin composition is adjusted by the admixture of a suitable organic solvent including alcohols, ketones, acetate esters, glycol ethers, glycol ether esters, petroleum hydrocarbons and the like.

Particular examples of the organic solvents include hexane, heptane, octane, nonane, decane, benzene, toluene, xylene, benzyl alcohol, methyl ethyl ketone, acetone, methyl isobutyl ketone, cyclohexanone, methanol, ethanol, propanol, butanol, hexanol, cyclohexanol, ethyleneglycol, diethyleneglycol, glycerol, ethyleneglycol monomethyl ether, ethyleneglycol monoethyl ether, propyleneglycol monomethyl ether, propyleneglycol monoethyl ether, diethyleneglycol monomethyl ether, diethyleneglycol monoethyl ether, diethyleneglycol dimethyl ether, diethyleneglycol diethyl ether, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, methyl lactate, ethyl lactate, methyl acetate, ethyl acetate, propyl acetate, butyl acetate, propyleneglycol monomethyl ether acetate, propyleneglycol monoethyl ether acetate, methyl propionate, ethyl propionate, methyl benzoate, ethyl benzoate, propyl benzoate, butyl benzoate, methyl butyrate, ethyl butyrate, propyl butyrate and the like as well as those petroleum hydrocarbon solvents available under the tradenames of Swazoles (products by Maruzen Petrochemical Co.), Solvessos (products by Tonen Petrochemical Co.) and the like.

Other optional additives to be added to the inventive resin composition according to need include dyes, e.g., auramine, rhodamine, methyl violet, methylene blue and malachite green, polymerization inhibitors, e.g., tri-p-nitrophenyl methyl, p-benzoquinone, p-tert-butyl catechol and dithiobenzoyl disulfide, electroconductive fine powders of carbon or metals for the control of the insulating resistivity, cationic, anionic and amphoteric surface active agents, e.g., salts of alkylsulfonic acid, salts of alkylphosphoric acid, salts of aliphatic amines and salts of aminocarboxylic acids, and so on.

The photosensitive resin composition of the invention after curing should have an insulating resistivity not exceeding $1.0 \times 10^{14}$ ohm·cm or, preferably, not exceeding $1.0 \times 10^{13}$ ohm·cm at room temperature as determined with application of a DC voltage of 1000 volts. When the insulating resistivity is too high, accumulation of static electricity may take place in the resist layer during sandblasting so that troubles are caused by an eventual electric discharge resulting in damages in the substrate body or short-circuiting in a circuit board under treatment.

A resist layer of the inventive photosensitive resin, composition on the surface of a substrate can be formed in several different ways. For example, the inventive resin composition is prepared in the form of a solution which is applied to the substrate surface by a known coating method such as screen printing. Alternatively, the resin composition is shaped in the form of a photosensitive dry film containing no solvent by a suitable sheeting method and the dry film is applied and bonded to the substrate surface and photolithographically patterned before sandblasting. In contrast to the conventional procedure for the formation of a patterned resist layer on the surface of electronic parts and the like, of which precise patterning of the resist layer is essential, by the application and transfer of a ready patterned resin film, the above mentioned method using a dry film of the inventive photosensitive resin composition is advantageous because of the high accuracy accomplished in the positioning of sandblasting for engraving. When engraving is desired in a resinous paste layer, the dry-film process is advantageous because the layer of paste can be freed from the attack of the coating composition in the form of a solution containing the photosensitive resin composition.

FIG. 1 of the accompanying drawing illustrates a vertical cross sectional view of an example of the dry film 2 mentioned above as sandwiched between two protective releasable films 1 and 3 having flexibility such as plastic films. These films 1,3 serve to temporarily protect the dry film 2 of the photosensitive resin composition during handling and transportation of the dry film 2 and are removed by peeling before use of the dry film 2. On of the protective films 1, which supports the dry film 2 of the photosensitive resin thereon, should have adequate flexibility. For example, films of a polyethylene terephthalate resin having a thickness of 15 to 125 μm are suitable for the purpose although films of other plastic resins such as polyethylene, polypropylene, polycarbonate, polyvinyl chloride and the like can also be used. The dry film 2 can be formed on the surface of this film 1 as a substrate by coating the film 1 with the photosensitive resin composition in the form of a solution by a suitable coating method using an applicator, bar coater, roll coater, curtain-flow coater and the like followed by drying to give a dried layer having a thickness of 10 to 100 µm as dried.

The other protective film 3 also serves for the temporary protection of the dry film 2 so that it is required to be free from spontaneous falling but to be easily removed by peeling just before use of the dry film 2. Satisfactory releasable films can be obtained by the treatment of a film of a plastic resin such as polyethylene terephthalate, polypropylene, polyethylene and the like having a thickness of 15 to 125 µm with a silicone-based releasing agent.

With an object to prevent the phenomenon of oxygen desensitization on the photosensitive resin composition and to prevent cohesive adhesion between the dry film 2 and the patterned photomask to be mounted thereon in direct contact for pattern-wise exposure to light, it is optional but advantageous to interpose a layer of a water-soluble resin between the protective film 1 and the dry film 2. Such an interposed layer of a water-soluble resin can be formed by coating the film 1 with an aqueous solution of a water-soluble polymer such as polyvinyl alcohol and partially saponified polyvinyl acetate in a concentration of 5 to 20% by weight by a suitable coating method followed by drying to give a dried layer having a thickness of 1 to 10 µm. If necessary, the layer of the water-soluble resin can be imparted with increased flexibility and increased releasability of the film 1 from the dry film 2 by the admixture of the above mentioned aqueous solution of the water-soluble resin for coating with a small amount of ethyleneglycol, propyleneglycol, polyethyleneglycol and the like. It is further optional that the aqueous solution is admixed with an organic solvent such as methyl alcohol, ethyleneglycol monomethyl ether, acetone and the like and a water-base defoaming agent in consideration of the viscosity and foaming behavior of the solution.

FIGS. 2A to 2E of the accompanying drawing each illustrate a step of the engraving process of a substrate body 6 by the use of the dry film prepared in the above described manner in the sequential order by a vertical cross sectional view.

Figure 2A:
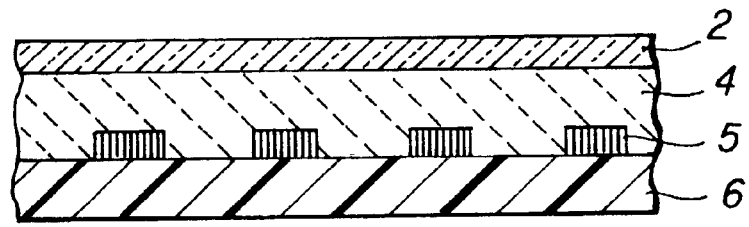
FIGS. 2A to 2E each illustrate a step in the sandblast engraving procedure according to the invention.

FIG. 2A illustrates a substrate body 6 on which a patterned electroconductive layer 5 is formed with covering of an insulating layer 4 and a photosensitive layer 2 of the inventive resin composition which is mounted on the layer 4 of the insulating material by putting the dry film illustrated in FIG. 1 after removal of one of the protective film 3 (reversed upside-down) followed by removal of the the other protective film 1 from the dry film 2. In order to ensure a good and intimate contacting condition of the photosensitive layer 2 to the insulating layer 4, it is preferable to undertake the so-called hot press-bonding method in which the substrate body 6 bearing the conductive patterned layer 5 and the insulating layer 4 is heated at an appropriate temperature before mounting of the dry film 2 thereon and the dry film 2 mounted thereon is pressed against the substrate body 6. Excellent adhesion is obtained between the photosensitive layer 2 and the insulating layer 4 because the photosensitive resin composition contains a carboxyl-modified urethane compound as the component (a).

Figure 2B:
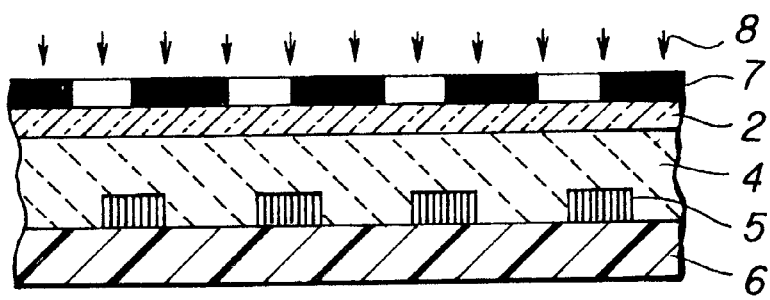
Figure 2C:
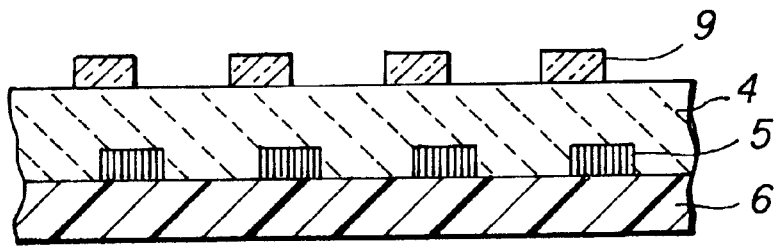

FIG. 2B illustrates the next step to follow the step of FIG. 2A for the pattern-wise exposure of the photosensitive layer 2 to ultraviolet light. Namely, a patterned photomask 7 is mounted in direct contact on the photosensitive layer 2 which is exposed pattern-wise to actinic rays 8 such as ultraviolet light emitted from a suitable light source such as low-pressure, high-pressure and ultrahigh-pressure mercury lamps, arc lamps, xenon lamps and the like to form a latent image of the pattern in the photosensitive layer. The pattern-wise exposure of the photosensitive layer 2 to actinic rays can also be performed by using excimer laser beams, X-rays and electron beams. Thereafter, the photomask is taken off and the latent image formed in the photosensitive layer 2 is developed to form a patterned resist layer 9 as is illustrated in FIG. 2C.

In the development treatment after the pattern-wise exposure to actinic rays, namely, the resin layer 2 in the unexposed areas is removed away to leave the patterned layer 9 of the cured resin composition. The developer solution used here can be a conventional alkaline developer solution containing an alkaline compound such as hydroxides, carbonates, hydrogencarbonates, phosphates and pyrophosphates of an alkali metal, e.g., lithium, sodium and potassium, primary amines, e.g., benzyl amine and butyl amine, secondary amines, e.g., dimethyl amine, dibenzyl amine and diethanol amine, tertiary amines, e.g., trimethyl amine, triethyl amine and triethanol amine, cyclic amines, e.g., morpholine, piperazine and pyridine, polyamines, e.g., ethylene diamine and hexamethylene diamine, quaternary ammonium hydroxides, e.g., choline, tetraethyl ammonium hydroxide, trimethyl benzyl ammonium hydroxide and triphenyl benzyl ammonium hydroxide, sulfonium hydroxides, e.g., trimethyl sulfonium hydroxide, diethyl methyl sulfonium hydroxide and dimethyl benzyl sulfonium hydroxide, buffer solutions containing a water-soluble silicate, and so on.

Figure 2D:
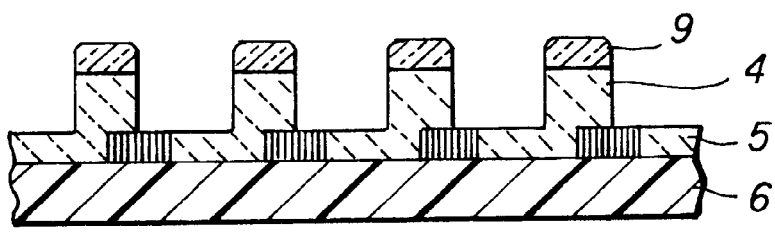

The next step to follow the development treatment giving the patterned resist layer 9 is engraving of the insulating layer 4 on the substrate 6 by sandblast until a desired depth of engraving can be obtained with the patterned layer of the cured resin composition 9 as the resist as is shown in FIG. 2D. The blast material used in the sandblasting is not particularly limitative and any of conventional ones can be used depending on the material of the body to be engraved. Examples of suitable blast materials include fine powders of silicon carbide, silicon dioxide, alumina, zirconia and the like as well as glass beads having a particle diameter of 2 to 100 µm.

Figure 2E:
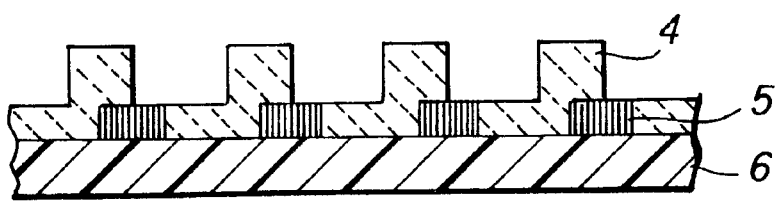

The final step of the engraving process to follow the sandblasting is removal of the patterned resist layer 9 which can be removed by using a suitable remover solution which is preferably an aqueous solution of an alkali hydroxide such as sodium hydroxide and potassium hydroxide having a pH of 13 or higher to expose the unengraved surface of the insulating layer 4 as is shown in FIG. 2E. Alternatively, it is a possible way that the patterned layer 9 of the cured resin composition is removed by incineration provided that the other parts can withstand the temperature for the incineration.

In the following, the present invention is described in more detail by way of examples as preceded by a description for the synthetic preparation procedures of urethane (meth) acrylate compounds as the component (a). In the description below, the term of "parts" always refers to "part by weight". Synthesis 1.

A urethane methacrylate compound, referred to as the component A-1 hereinafter, was prepared by keeping a mixture of 220 parts of a hydroxy-terminated polyethyleneglycol having a number-average molecular weight of 1100, 2 parts of diphenyl tin diacetate and 55 parts of methyl ethyl ketone at 80° C. under agitation in a reaction vessel, into which 48.9 parts of hexamethylene diisocyanate were added dropwise followed by further continued agitation of the mixture for 2 hours at the same temperature and then 26.5 parts of 2-hydroxyethyl methacrylate were added dropwise thereinto followed by further continued agitation of the mixture for additional 2 hours at 80° C. The thus obtained urethane methacrylate compound had a number-average molecular weight of 3000.

Synthesis 2.

A urethane acrylate compound, referred to as the component A-2 hereinafter, was prepared by keeping a mixture of 120 parts of a hydroxy-terminated polyester diol having a number-average molecular weight of 2400, which was a polycondensation esterification product of adipic acid, propyleneglycol and 2,2-bis(hydroxymethyl) propionic acid, 2 parts of diphenyl tin diacetate and 50 parts of methyl ethyl ketone at 80° C. under agitation in a reaction vessel, into which 22.5 parts of isophorone diisocyanate were added dropwise followed by further continued agitation of the mixture for 2 hours at the same temperature and then 11.6 parts of 2-hydroxyethyl acrylate were added dropwise thereinto followed by further continued agitation of the mixture for additional 2 hours at 80° C. The thus obtained urethane acrylate compound had a number-average molecular weight of 3000.

Synthesis 3.

A urethane acrylate compound, referred to as the component A-3 hereinafter, was prepared by keeping a mixture of 125 parts of a hydroxy-terminated polyester diol having a number-average molecular weight of 2500, which was a ring-opening polymerization esterification product of ε-caprolactone, 2 parts of diphenyl tin diacetate and 50 parts of methyl ethyl ketone at 80° C. under agitation in a reaction vessel, into which 17.0 parts of hexamethylene diisocyanate were added dropwise followed by further continued agitation of the mixture for 2 hours at the same temperature and then 13.0 parts of 2-hydroxyethyl acrylate were added dropwise thereinto followed by further continued agitation of the mixture for additional 2 hours at 80° C. The thus obtained urethane acrylate compound had a number-average molecular weight of 3000.

Synthesis 4.

A urethane acrylate compound, referred to as the component A-4 hereinafter, was prepared by keeping a mixture of 150 parts of a hydroxy-terminated polyester diol having a number-average molecular weight of 3000, which was an esterexchange reaction product of 1,6-hexane diol and succinic anhydride, 2 parts of diphenyl tin diacetate and 30 parts of methyl ethyl ketone at 80° C. under agitation in a reaction vessel, into which 50.6 parts of hexamethylene diisocyanate were added dropwise followed by further continued agitation of the mixture for 2 hours at the same temperature and then 11.6 parts of 2-hydroxyethyl acrylate were added dropwise thereinto followed by further continued agitation of the mixture for additional 2 hours at 80° C. The thus obtained urethane acrylate compound had a number-average molecular weight of 9800.

In the following Examples, one of the above prepared components A-1 to A-4 was combined with the component (b), component (c), component (d) which was a photopolymerizable monomeric compound, and component (e), which was a thermal polymerization inhibitor, each selected from the group of the compounds characterized below. In the Comparative Examples, the resin composition was prepared by omitting the component (a) and, in Comparative Examples 2 and 3, the component (d) was further omitted.

Component (b)

B-1: Cellulose acetate phthalate having an acid value of 120 mg KOH/g and containing 75% by weight of methyl ethyl ketone as a solvent (KC-71, a product by Wako Jun-yaku Co.)

B-2: Copolymer of methacrylic acid, butyl methacrylate and acrylonitrile having an average molecular weight of about 80000 and an acid value of 150 mg KOH/g and containing 50% by weight of ethyl acetate as a solvent (OLA-301, a product by Toa Gosei Kagaku Co.)

B-3: Copolymer of methacrylic acid, butyl methacrylate and acrylonitrile in a weight proportion of 45:45:10 having an average molecular weight of about 77000 and an acid value of 290 mg KOH/g and containing 50% by weight of ethyl acetate as a solvent B-4: Copolymer of methacrylic acid, butyl methacrylate, 2-hydroxyethyl methacrylate and acrylonitrile in a weight proportion of 7:40:35:18 having an average molecular weight of about 85000 and an acid value of 45 mg KOH/g and containing 50% by weight of ethyl acetate as a solvent Component (c) (photopolymerization initiator)

C-1: 2,4-Diethyl thioxanthone

C-2: 2-Isoamyl 2,4-dimethylamino benzoate

C-3: 2,4,6-Trimethylbenzoyl diphenyl phosphine oxide

Component (d) (photopolymerizable monomer)

D-1: Trimethylolpropane triacrylate Component (e) (thermal polymerization inhibitor)

E-1: Dimethyl benzyl ketal

EXAMPLES 1 TO 8 AND COMPARATIVE EXAMPLES 1 TO 3

The photosensitive resin composition of Example 1 was prepared by uniformly blending 40 parts of the component A-1, 60 parts of the component B-1, 2 parts of the component C-1, 1 part of the component C-2 and 0.05 part of the component E-1. The formulation of the composition in each of Examples 2, 3 and 4 was the same as in Example 1 excepting replacement of the component A-1 with the same amount of the component A-2, A-3 or A-4, respectively.

The formulation of the composition in Example 5 was the same as in Example 4 excepting replacement of 60 parts of the component B-1 with 30 parts of the component B-2. The formulation of the composition in Example 6 was the same as in Example 4 excepting replacement of 2 parts of the components C-1 and 1 part of the component C-2 with 3 parts of the component C-3.

The formulation of the composition in Example 7 was the same as in Example 4 excepting omission of the component C-2 and, instead, an increase of the amount of the component C-1 from 2 parts to 3 parts. The formulation of the composition in Example 8 was the same as in Example 4 excepting additional admixture of 4 parts of the component D-1.

The photosensitive resin composition of Comparative Example 1 was prepared by uniformly blending 90 parts of the component B-2, 2 parts of the component C-1, 1 part of the component C-2, 20 parts of the component D-1 and 0.05 part of the component E-1. The formulations of the photosensitive resin compositions of Comparative Examples 2 and 3 were each the same as in Comparative Example 1 excepting omission of the component D-1 and replacement of 90 parts of the component B-2 with 30 parts of the component B-3 or B-4, respectively.

Each of the above prepared photosensitive resin compositions was subjected to the measurement of the insulating resistivity before and after curing in the following manner by using a high-resistance meter (Model 4339A, manufactured by Hewlett Packard Co.). Thus, a glass cloth-reinforced epoxy resin laminate board provided thereon with a PZT wiring in a thickness of 45 μm and a line width of 625 μm at a pitch of 1825 μm was coated with the photosensitive resin composition by using an applicator in a thickness of 50

μm after drying and the insulating resistivity of the coating layer was measured after drying. Further, the coating layer of the resin composition was irradiated with ultraviolet light by using a chemical lamp in an exposure dose of 100 mJ/cm$^2$ to effect curing and the insulating resistivity of the thus cured layer was again measured. The results are shown in Table 1 below.

TABLE 1

|  | Resistivity before curing × 10$^{12}$ ohm · cm | Resistivivty after curing × 10$^{12}$ ohm · cm |
| --- | --- | --- |
| Example 1 | 19.8 | 30.6 |
| Example 2 | 16.4 | 20.1 |
| Example 3 | 8.4 | 9.7 |
| Example 4 | 5.1 | 6.4 |
| Example 5 | 18.7 | 38.1 |
| Example 6 | 11.7 | 23.1 |
| Example 7 | 5.9 | 6.9 |
| Example 8 | 4.4 | 5.3 |
| Comparative Example 1 | 70.5 | 432.4 |
| Comparative Example 2 | 8.9 | 18.1 |
| Comparative Example 3 | 9.2 | 18.9 |

In the next place, each of the resin compositions excepting that of Example 8 was shaped in the form of a dry film and used as a sandblast resist in the engraving work of the insulating flattened layer of a plasma display panel having a patterned ITO layer and an insulating flattened layer on a glass plate.

Thus, a polyethylene terephthalate film of 50 μm thickness was coated with the resin composition in a thickness of 50 μm as dried followed by drying to give a photosensitive resin layer on which a polyethylene terephthalate film of 25 μm thickness as a releasable protective film was laminated to complete a photosensitive dry film.

After removal of the second polyethylene terephthalate film, the dry film was applied at the photosensitive resin layer to the plasma display panel and bonded thereto in intimate contact. Thus, the photosensitive resin layer of the dry film was brought into direct contact under vacuum with the plasma display panel kept at 80° C. followed by removal of the first polyethylene terephthalate film by peeling so as to expose the photosensitive resin layer which was exposed to ultraviolet light from an ultrahigh-pressure mercury lamp in an exposure dose of 100 mJ/cm$^2$ through a photomask having a line-and-space pattern of 60 μm line width in direct contact with the photosensitive resin layer.

The thus pattern-wise exposed photosensitive layer was subjected to a development treatment by spraying a 0.2% aqueous solution of sodium carbonate under a spraying pressure of 1.5 kg/cm$^2$.

The plasma display panel provided with the patterned resist layer in the above described manner was subjected to a sandblasting test by blasting a #800 silicon dioxide powder for 180 seconds under a blasting pressure of 4 kg/cm$^2$ followed by a heat treatment for 5 hours at a temperature of 540 to 560° C. Table 2 below shows the results of the evaluation tests of the above described engraving procedure for the developability of the resist layer, film thickness reduction by the sandblasting and condition of the plasma display panel after sandblasting according to the following respective criteria.

The photosensitive resin composition prepared in Example 8 was subjected to the sandblasting test in the same manner as above except that, instead of shaping the composition in the form of a dry film, the composition in the form of a solution as such was applied to the plasma display panel using an applicator in a thickness of 50 μm as dried followed by drying before pattern-wise exposure to ultraviolet light.

(1) Developability
  A: development completed within 30 seconds
  B: development completed within 30 seconds but with a film thickness reduction in excess of 10%
  C: development incomplete after 180 seconds of development treatment (2) Film thickness reduction by sandblast
  A: not exceeding 20%
  B: 20 to 50%
  C: in excess of 50% with some chipping of the patterned resist layer (3) Condition of plasma display panel after heat treatment
  A: engraving with high fidelity to photomask pattern
  B: electric discharge observed in a part during sandblasting though without damages by discharge as viewed from lower surface
  C: damages by discharge with short-circuiting in a part of electrodes and insulating layer as viewed from lower surface

TABLE 2

|  | Developability | Film thickness reduction by sandblast | Condition of plasma display panel after heat treatment |
| --- | --- | --- | --- |
| Example 1 | A | A | B |
| Example 2 | A | A | B |
| Example 3 | A | A | A |
| Example 4 | A | A | A |
| Example 5 | A | A | B |
| Example 6 | A | A | B |
| Example 7 | B | B | A |
| Example 8 | A | A | A |
| Comparative Example 1 | A | B | C |
| Comparative Example 2 | A | C | A |
| Comparative Example 3 | C | A | A |

What is claimed is:

1. A photosensitive dry film laminate suitable as a resist against sandblasting which comprises:
  (A) a layer of a photosensitive resin composition, formed on a plastic resin film, comprising, as a uniform blend:
    (a) 100 parts by weight of a urethane compound having a terminal (meth)acrylate group, which is obtained from a polyether or polyester compound having a terminal hydroxy group, a diisocyanate compound and a (meth)acrylate compound having a hydroxy group;
    (b) an alkali-soluble polymeric compound having an acid value of from 50 to 250 mg KOH/g in such an amount that a weight proportion of component (a) to component (b) is from 30:70 to 95:5; and
    (c) from 0.1 to 20 parts by weight of a photopolymerization initiator; and
  (B) two films having flexibility laminated on surfaces thereof and sandwiching the layer (A) in a releasable fashion.

2. The photosensitive dry film as claimed in claim 1 in which the layer (A) has a thickness of from 10 to 100 μm.

* * * * *